United States Patent
Murata

(10) Patent No.: US 8,119,312 B2
(45) Date of Patent: Feb. 21, 2012

(54) MANUFACTURING METHOD FOR A SEMICONDUCTOR DEVICE

(75) Inventor: Michihiro Murata, Chiba (JP)

(73) Assignee: Seiko Instruments Inc. (JP)

( * ) Notice: Subject to any disclaimer, the term of this patent is extended or adjusted under 35 U.S.C. 154(b) by 189 days.

(21) Appl. No.: 12/658,383

(22) Filed: Feb. 5, 2010

(65) Prior Publication Data
US 2010/0203433 A1    Aug. 12, 2010

(30) Foreign Application Priority Data

Feb. 6, 2009 (JP) .................................. 2009-026506
Dec. 28, 2009 (JP) ................................ 2009-298744

(51) Int. Cl.
*G03F 9/00* (2006.01)
*G03C 5/00* (2006.01)

(52) U.S. Cl. ............................ 430/30; 430/311; 430/394
(58) Field of Classification Search .................... 430/30, 430/311, 394
See application file for complete search history.

(56) References Cited

OTHER PUBLICATIONS

Patent abstracts of Japan, Publication No. 2002-195912, Publication date Jul. 10, 2002.
Patent abstracts of Japan, Publication No. 2006-108305, Publication date Apr. 20, 2006.

*Primary Examiner* — Christopher Young
(74) *Attorney, Agent, or Firm* — Adams & Wilks

(57) ABSTRACT

In a manufacturing method for divisionally exposing a wafer, a focus correction processing is performed after a shot is moved to a position where the focus correction processing for all foci is enabled when the shot is at a wafer outer periphery, and a portion overlapped with an adjacent exposure area is shielded from light by a reticle blind to expose only an opening area unshielded by the reticle blind.

8 Claims, 4 Drawing Sheets

MANUFACTURING METHOD FOR A SEMICONDUCTOR DEVICE

BACKGROUND OF THE INVENTION

1. Field of the Invention

The present invention relates to a manufacturing method of a semiconductor device, in particular relates to an exposure method for a semiconductor device

2. Description of the Related Art

In a photolithography process during manufacturing an electronic device such as a semiconductor element, a liquid crystal display element, an image capture element such as a charge coupled device (CCD), a plasma display element and a thin film magnetic head (hereinafter generically referred to as "electronic device"), a pattern of a photomask or a reticle (hereinafter generically referred to as "reticle") is transferred by a projection exposure device having a projection optical system onto a substrate such as a wafer or a glass plate, a surface of which is coated with a photosensitizing agent such as a photoresist. As the projection exposure device, there is employed a reduced projection exposure device of a step and repeat system (so-called stepper), a scanning projection exposure device of a step and scan system (so-called scanner), or the like.

When the pattern is transferred onto the substrate by the projection exposure device, in order to suppress the occurrence of an exposure failure caused by defocus of the projection optical system, there is a need that an exposure area (an area irradiated with an illumination light) on the substrate is disposed in a range of a focal depth of the best imaging surface of the projection optical system. To achieve this, the best focus position of the projection optical system must be measured with high precision, and a position of the substrate must be controlled in such a manner that the exposure area on the substrate is disposed at the best focus position. With the recent miniaturization of the exposure pattern, a higher focusing precision has been required.

As one of methods of measuring the best focus position of the projection optical system, there is a method in which a measurement mark formed on the reticle, for example, a line and space mark is irradiated with the illumination light, a spatial image (projection image) of the measurement mark formed by the projection optical system is measured by the aid of a spatial image measuring device, and the best focus position is calculated on the basis of the measurement result. Exemplary documents are JP 2006-108305 A and JP 2002-195912 A.

In the measurement of focus and the correction of focus by the spatial image measuring device, the focus correction can be processed at five positions within a shot inside of the wafer, but is performed at less than five positions in the exposure area (shot) protruded from the wafer outer periphery, giving a little information After a calculation, information low in precision which is short in the focus range within the shot and slope data is fed back to a stage drive device.

As a result, in the reduced projection exposure device having a short focal point and a larger numerical aperture (NA), when the miniaturized pattern is transferred and projected, defocus occurs, thereby making it difficult to accurately transfer a faithful pattern of the reticle.

Accordingly, even if the above-mentioned best focus position is measured around the best focus position at the time of previous measurement, there is a case in which the best focus position cannot be detected. In this case, the spatial image is measured at 15 steps in the manner as described above while stepping the measurement pattern in an optical axial direction of the projection optical system at a relatively large interval of about 2 times the step pitch in normal measurement (for example, 0.3 μm). Thus, while a large measurement range (measurement range twice as large as normal measurement) is covered, measurement (called "rough measurement") for roughly searching for the best focus position is performed. Thereafter, the above-mentioned normal measurement (called "fine measurement") is performed around the obtained best focus position to detect the best focus position with high precision.

SUMMARY OF THE INVENTION

Even if the best focus position is measured in the conventional manner as described above, there is, however, a case in which the best focus position cannot be detected. The reason is that an image plane may become uneven in the exposure area (shot) protruded from the wafer outer periphery as compared with the wafer center due to wafer adsorption to a wafer stage. Also, it can be thought that a formation of an insulating film and a metal film on the rear surface of the wafer in a preceding process makes the flatness of the wafer at the wafer outer periphery different as compared with the wafer central portion.

With an aim to cope with the above problem, there is a method for narrowing the entire exposure area (shot) to reduce an influence of the image plane. However, the method leads to a lowering of throughput in the projection exposure system because the number of shots increases. Also, there is a method in which the wafer outer periphery is excluded from the exposure area. The wafer yield is lowered in this method, causing a problem of increase in cost.

The present invention has been made in view of the above-mentioned problem, and an object of the present invention is to provide an exposure method and an exposure device capable of appropriate exposing and transferring a desired pattern by detecting a best focus position with high precision.

In order to solve the above-mentioned problem, a manufacturing method for an exposure of a semiconductor device according to the present invention employs the following means.

First, a manufacturing method for a semiconductor device including a divisional exposure of a wafer, includes: determining presence or absence of all of focus detection positions within an area of a subsequent shot on the wafer, after exposure of a previous shot has been completed; moving the subsequent shot to a position where focus correction processing is enabled at all of the focus detection positions within the subsequent shot when at least one focus detection position among all of the focus detection positions is not on the wafer; performing defocus and focus correction processing by the moved subsequent shot; shielding an area overlapped with an adjacent exposure area from light by a reticle blind; and exposing a first small exposure area through an opening area surrounded by the reticle blind.

Further, in the manufacturing method for a semiconductor device, the number of semiconductor devices formed in the first small exposure area is maximized.

Also, a manufacturing method for a semiconductor device, which divisionally exposes a wafer, includes: determining presence or absence of all of focus detection positions within an area of a subsequent shot on the wafer, after exposure of a previous shot has been completed; moving the subsequent shot to a first position where focus correction processing is enabled at all of the focus detection positions within the subsequent shot when at least one focus detection position among all of the focus detection positions is not on the wafer;

performing defocus detection and focus correction processing by the subsequent shot moved to the first position; shielding an area overlapped with an adjacent exposure area from light by a reticle blind; exposing a first small exposure area through an opening area surrounded by the reticle blind; moving the subsequent shot at the first position to a second position so that the subsequent shot is inscribed in a wafer outer periphery; performing defocus detection and focus correction processing by the subsequent shot moved to the second position; shielding an area overlapped with the adjacent exposure area and the first small exposure area from light by the reticle blind; and exposing a second small exposure area through an opening area surrounded by the reticle blind that shields the area overlapped with the adjacent exposure area and the first small exposure area from light.

Further, in the manufacturing method for a semiconductor device, a number of semiconductor devices formed in the first small exposure area and the second small exposure area is maximized.

With application of the manufacturing method for the semiconductor device as described above, the best focus position may be detected on the entire wafer surface with high precision, and a desired pattern may be appropriately exposed and transferred. Also, a larger number of semiconductor chips may be formed on the wafer.

DETAILED DESCRIPTION OF THE PREFERRED EMBODIMENTS

Hereinafter, a description is made of embodiments of the present invention with reference to FIGS. 1 to 4.

Figure 1:
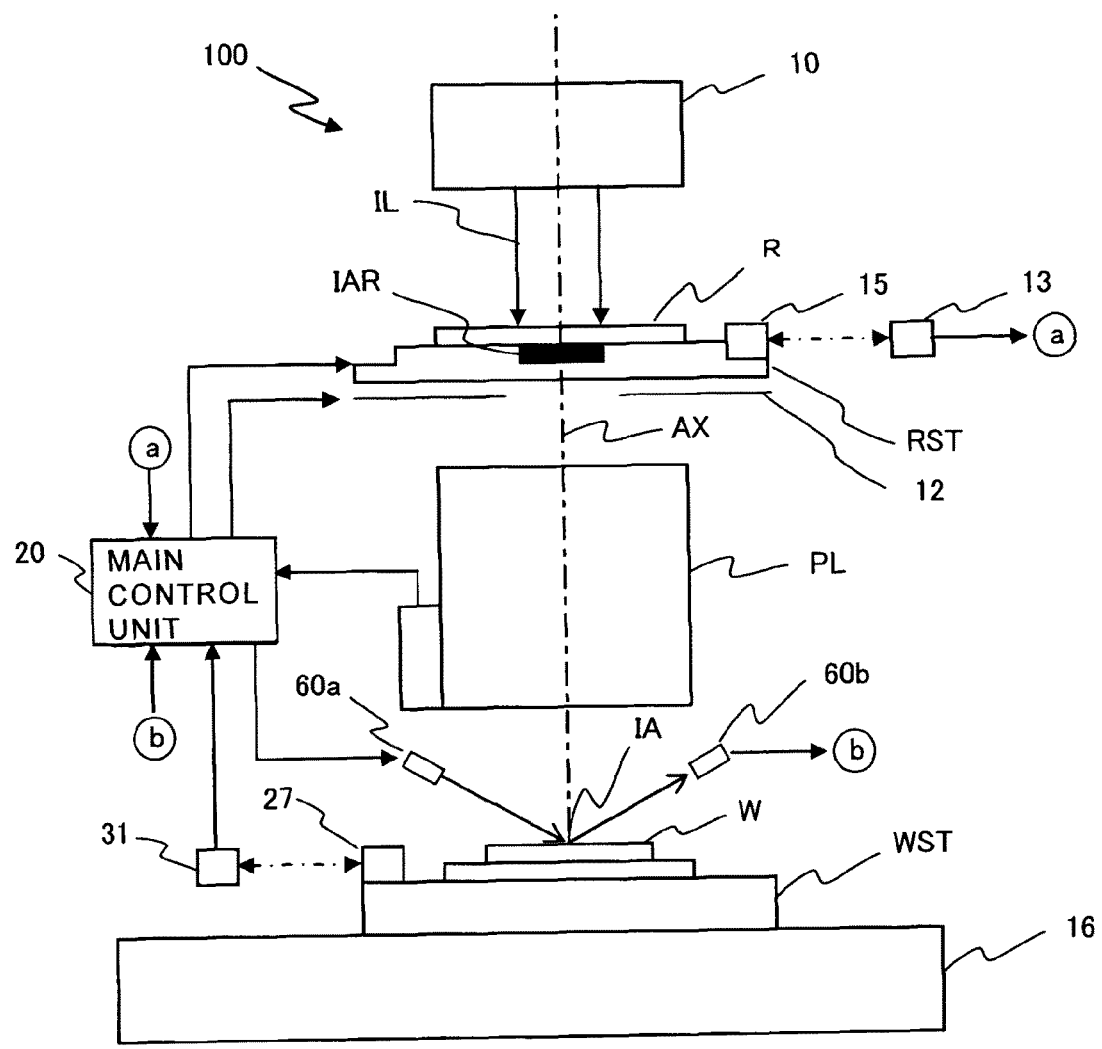
FIG. 1 is a diagram illustrating an entire configuration of an exposure device according to embodiments of the present invention.

FIG. 1 is a diagram illustrating a configuration of an exposure device 100. The exposure device 100 is a reduced projection exposure device of a step and repeat system, that is, a so-called stepper.

The exposure device 100 includes an illumination system 10 as an illumination device including a light source and an illumination optical system, a reticle stage RST for holding a reticle R as a mask, a projection optical system PL, a wafer stage WST as a substrate stage for holding a wafer W as a substrate, which is capable of free moving in an X-Y plane, a control system for controlling those components, and so on.

The illumination system 10 has, although not shown, the light source, an illumination equalization optical system (including collimator lens, a fly eye lens, and so on), a relay lens system, a reticle blind as an illumination field stop, a capacitor lens, and so on.

As the light source, there is used a light source of a high-pressure mercury vapor lamp that outputs an i-ray beam (365 nm in wavelength) or a g-ray beam (436 nm in wavelength) in this example.

As the blind of the reticle (masking blade), there is used a movable reticle blind 12 having a variable opening shape. The blind has an opening portion having variable position and width. In FIG. 1, the blind is disposed in the vicinity of the reticle R on the projection optical system side. The blind is disposed within a focusing range as with the reticle, and, for example, a liquid crystal shutter may be used so as to allow for drive in micron order. The blind is disposed in the vicinity of the reticle R on the projection optical system PL side. It should be noted that the blind may be disposed in the vicinity of the reticle R on the illumination system side as in the conventional art if the blind is within the focusing range. With such an illumination system 10 as described above, the illumination light (hereinafter called "illumination light IL") as an exposure light generated by the light source is converted into a light beam that is substantially uniform in illumination distribution by the illumination equalization optical system after having passed through the shutter (not shown). The illumination light IL emitted from the illumination equalization optical system reaches the reticle blind through the relay lens system. The light beam that has passed the reticle blind passes through the relay lens system and the condenser lens system, and irradiates, with even illuminance, an illumination area IAR of the reticle R on which a circuit pattern and so on are drawn.

It should be noted that the movable reticle blind 12 is controlled by a main control unit 20 when exposure starts and ends, and further restricts the illumination area IAR to prevent an unnecessary portion from being exposed. Also, in this embodiment, the movable reticle blind 12 is also used to set the illumination area in a recognition device for detecting a relative position to the wafer outer periphery, a calculation device for calculating a travel distance to a position where the focus correction processing is enabled at five positions within the shot, which are described later, and in measurement of a positional relationship with the adjacent exposure areas (shots).

Onto the reticle stage RST is fixed the reticle R by, for example, a vacuum adsorption (or electrostatic adsorption). In this example, the reticle stage RST may be finely driven by a reticle stage drive system (not shown) including a linear motor and so on, two-dimensionally (in an X-axial direction, a Y-axial direction, and a rotating direction (θz direction) about a Z-axis orthogonal to an X-Y plane) in the X-Y plane perpendicular to an optical axis AX of the projection optical system PL which is described later. Also, the reticle stage RST may travel on a reticle base (not shown) at a designated scanning speed in the Y-axial direction. The reticle stage RST has a travel stroke in the Y-axial direction as long as the entire surface of the reticle R may traverse at least the optical axis AX of the projection optical system PL.

Onto the reticle stage RST is fixed a moving mirror 15 for reflecting a laser beam from a reticle laser interferometer (hereinafter called "reticle interferometer") 13, and a position of the reticle stage RST in the X-Y plane (including rotation in a θz direction being a rotating direction about the Z-axis) is always detected by the reticle interferometer 13 with resolution of, for example, about 0.5 to 1 nm. In fact, on the reticle stage RST are provided a moving mirror having a reflection surface orthogonal to a scanning direction (Y-axial direction) during scanning exposure, and a moving mirror having a reflection surface orthogonal to a nonscanning direction (X-axial direction). Also, at least two reticle interferometers 13 are provided in the Y-axial direction, and at least one reticle interferometer 13 is provided in the X-axial direction. In FIG. 1, only the moving mirror 15 and the reticle interferometer 13 are typically illustrated among those components.

The positional information on the reticle stage RST from the reticle interferometer 13 is transmitted to the main control unit 20 including a workstation (or microcomputer), and so on. The main control unit 20 controls the driving of the reticle stage RST through the reticle stage drive system on the basis of the positional information on the reticle stage RST.

The projection optical system PL is a bilateral telecentric reduction system which is disposed vertically below the reticle stage RST. As the projection optical system PL is used a refractive optical system having a plurality of lens elements arranged at regular intervals along the direction of the optical axis AX of the illumination light IL. In this embodiment, the projection magnification of the projection optical system PL is ⅕, as a result of which a reduced image (partially inverted image) of the circuit pattern of the reticle R within the illumination area IAR on the reticle R which is illuminated with the illumination light IL from the illumination system 10 is formed on the wafer W whose surface is coated with a photoresist.

The wafer stage WST is disposed on a stage base 16, and freely driven in a two-dimensional X-Y plane (including $\theta z$ rotation) along an upper surface of the stage base 16 by a wafer stage drive system (not shown) including, for example, a magnetic levitation two-dimensional linear actuator. The two-dimensional linear actuator has a z-drive coil in addition to an x-drive coil and a y-drive coil, and the wafer stage WST is so configured as to be capable of being finely driven also in three degrees of freedom directions of Z, $\theta x$ (rotating direction about the X-axis), and $\theta y$ (rotating direction about the Y-axis).

A moving mirror 27 is fixed onto the wafer stage WST for reflecting a laser beam from a wafer laser interferometer (hereinafter called "wafer interferometer") 31. The wafer interferometer 31 always detects the positions of the wafer stage WST in the five degrees of freedom directions (X-, Y-, $\theta z$-, $\theta x$-, and $\theta z$-directions) except for the Z-direction, for example, with the resolution of about 0.5 to 1 nm. Also, the wafer interferometers 31 are disposed in the Y-axial direction and the X-axial direction, respectively. In FIG. 1, only the moving mirror 27 and the wafer interferometer 31 are typically illustrated.

The positional information (or velocity information) on the wafer stage WST is transmitted to the main control unit 20, and the main control unit 20 controls the position of the wafer stage WST in the X-Y plane through the wafer stage drive system (not shown) on the basis of the positional information (or velocity information).

The exposure device 100 is equipped with, as illustrated in FIG. 1, an oblique-incident light multipoint focal position detection system (focus sensor) including an irradiation system 60a having a light source whose on/off operation is controlled by the main control unit 20, and irradiating an imaging light beam for forming an image of a large number of pin holes or slits toward the imaging surface of the projection optical system PL from an oblique direction with respect to the optical axis AX, and a light receiving system 60b receiving the reflected light beam of the imaging light beam from the wafer W surface. When a focus variation occurs in the projection optical system PL, the main control unit 20 controls an inclination of a parallel plate (not shown) with respect to an optical axis of the reflected light beam in the light receiving system 60b, to thereby offset the multipoint focal position detection system (60a, 60b) according to the focus variation of the projection optical system PL to perform the calibration.

It should be noted that the detailed configuration of the same multipoint focal position detection system (focus sensor) as the multipoint focal position detection system (60a, 60b) according to this embodiment is disclosed in, for example, JP 6-283403 A.

The main control unit 20 controls the travel of the wafer stage WST in the Z-axial direction and the two-dimensional inclination (that is, rotation in the $\theta x$ and $\theta y$ directions) through the wafer stage drive system (not shown), on the basis of a defocus signal (defocus signal) from the light receiving system 60b, for example, an S curve signal during, for example, the scanning exposure so that the defocus becomes 0. That is, the main control unit 20 controls the travel of the wafer stage WST by the aid of the multipoint focal position detection system (60a, 60b), to thereby execute autofocus (automatic focus) and autoleveling (automatic leveling) which substantially conform the imaging surface of the projection optical system PL to the surface of the wafer W within the illumination area of the illumination light IL (imaging relationship with illumination area IAR).

Then, a first embodiment of the present invention is described with reference to FIG. 2.

Figure 2:
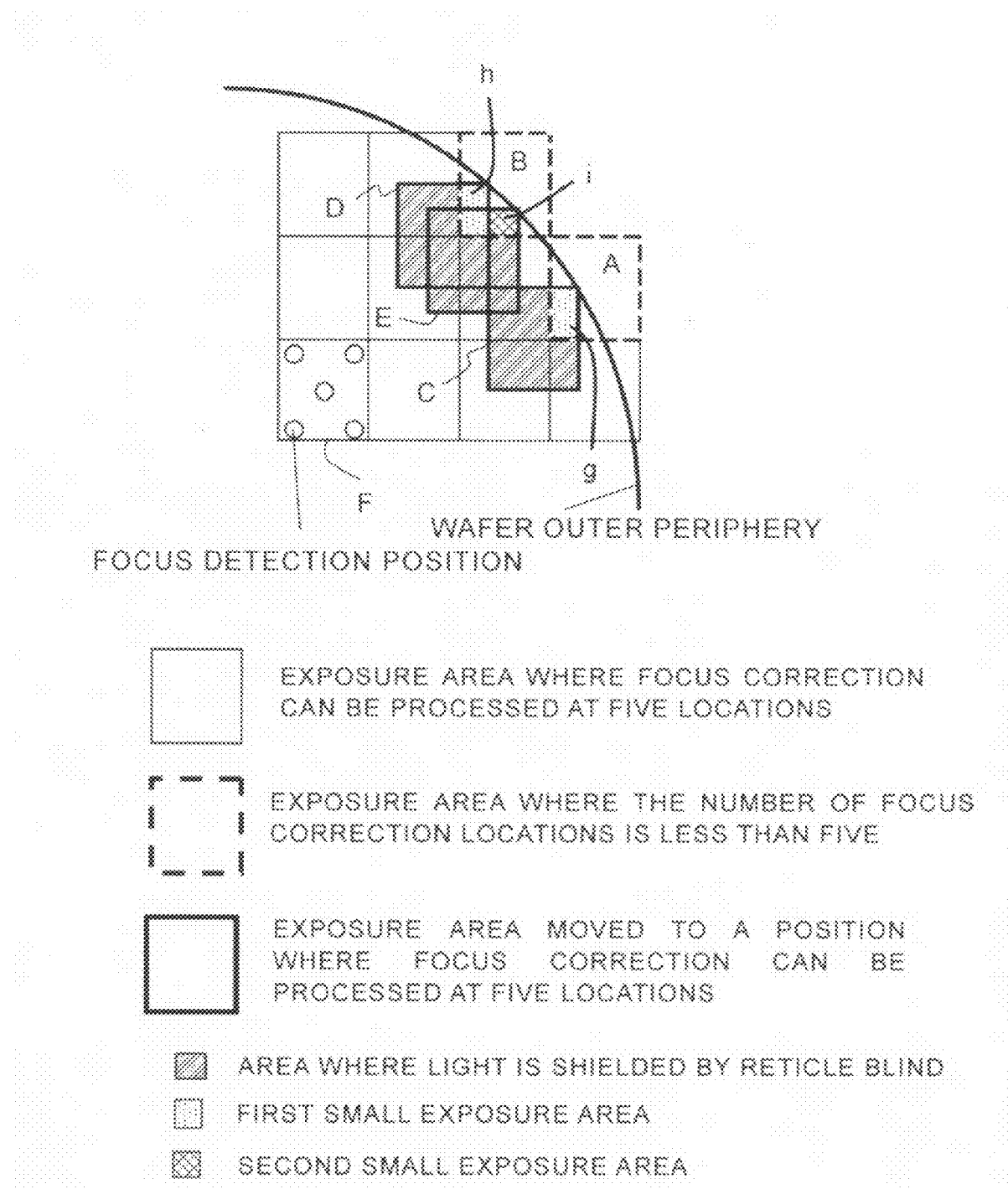
FIG. 2 is a diagram illustrating an exposure area (shot) at a wafer outer periphery according to the embodiments of the present invention.

FIG. 2 illustrates an exposure area (shot) at the wafer outer periphery according to the embodiment of the present invention.

One exposure area of the exposure device 100 is about 20 mm×20 mm, and therefore an exposure process for a sheet of wafer is completed through exposure of several ten times. Among a plurality of exposure areas, an exposure area being a start point is selected to a position where focus correction is enabled at five positions within a shot. In a shot F illustrated in FIG. 2, the focus detection positions at five positions are included within the shot, the focus correction processing is enabled, and an appropriate pattern may be formed over the entire shot. The exposure area such as the shot F is set as the start point, and the exposure processing is then performed on an adjacent exposure area.

When the exposure area comes to the wafer outer periphery, there is a case, however, in which the entire exposure area is not located within the wafer surface and protruded from the wafer outer periphery. For example, at a position of a shot A as illustrated in FIG. 2, four positions of upper right, lower right, upper left, and center among the five focus detection positions do not exist in the wafer surface, and the focus detection is performed at only one position of lower left. In this case there is no information on defocus of the entire shot A, and the entire shot A cannot be appropriately autofocused or autoleveled.

Under the above circumstance, the subsequent exposure area is not moved to the shot A, but moved to a position of a shot C where the entire shot is included in the wafer surface. At the position of the shot C, the focus detection is performed at five positions, and on the basis of the detection information, the shot C is autofocused or autoleveled. Then, a portion overlapped with the adjacent exposure area is shielded from light by the reticle blind to expose only a first small exposure area g. In this case, it is needless to say that the position of the shot C is determined so that the first small exposure area g has the largest area. With this arrangement, the imposition efficiency of semiconductor chips on the wafer is improved. That is, a larger number of semiconductor devices (semiconductor chips) are formed on the wafer.

Subsequently, a second embodiment is described with reference to a shot B in FIG. 2.

In the shot B, similarly to the shot A, the focus detection cannot be performed at four positions within the shot, and the entire shot B cannot be appropriately autofocused or autoleveled. Under the above circumstance, the subsequent exposure area is not moved to the shot B, but moved to a position of a shot D where the entire shot is included in the wafer surface. At the position of the shot D, the focus detection is performed at five positions, and on the basis of the detection information, the shot D is autofocused or autoleveled. The adjacent exposure area is, then, shielded from light by the reticle blind to expose only a first small exposure area h. With the above operation, double exposure of the adjacent exposure area may be avoided. The subsequent exposure area is, then, moved to a position of a shot E where the entire shot is included in the wafer surface.

At the position of the shot E, the focus detection is performed at five positions, and on the basis of the detection information, the shot E is autofocused or autoleveled. Then, the reticle blind is disposed so that an area overlapped with the adjacent exposure area and the first small exposure area h are shielded from light to expose only a second small exposure area i. In this case, the positions of the shot D and the shot E are determined so that the number of semiconductor devices (semiconductor chips) formed in an area combining the first small exposure area h with the second small exposure area i becomes largest.

As has been described above, with application of the exposure method according to the present invention, the best focus position may be detected on the entire wafer surface with high precision, and a desired pattern may be appropriately exposed and transferred. Also, a larger number of semiconductor chips are formed on the wafer. It should be noted that at the wafer outer periphery, the semiconductor device is located at a wafer edge, and may not be normally formed. Alternatively, this area is set as invalid in advance, and for example, an area of 3 mm from the edge of the wafer outer periphery is excluded, and the number of semiconductor devices (semiconductor chips) may be maximized. A wafer radius and an excluded width of the edge which are parameters of the exposure device are determined, and set by algorithm that does not consider the area as the small exposure area.

Subsequently, an exposure method according to the present invention is described with reference to FIGS. 3 and 4.

Figure 3:
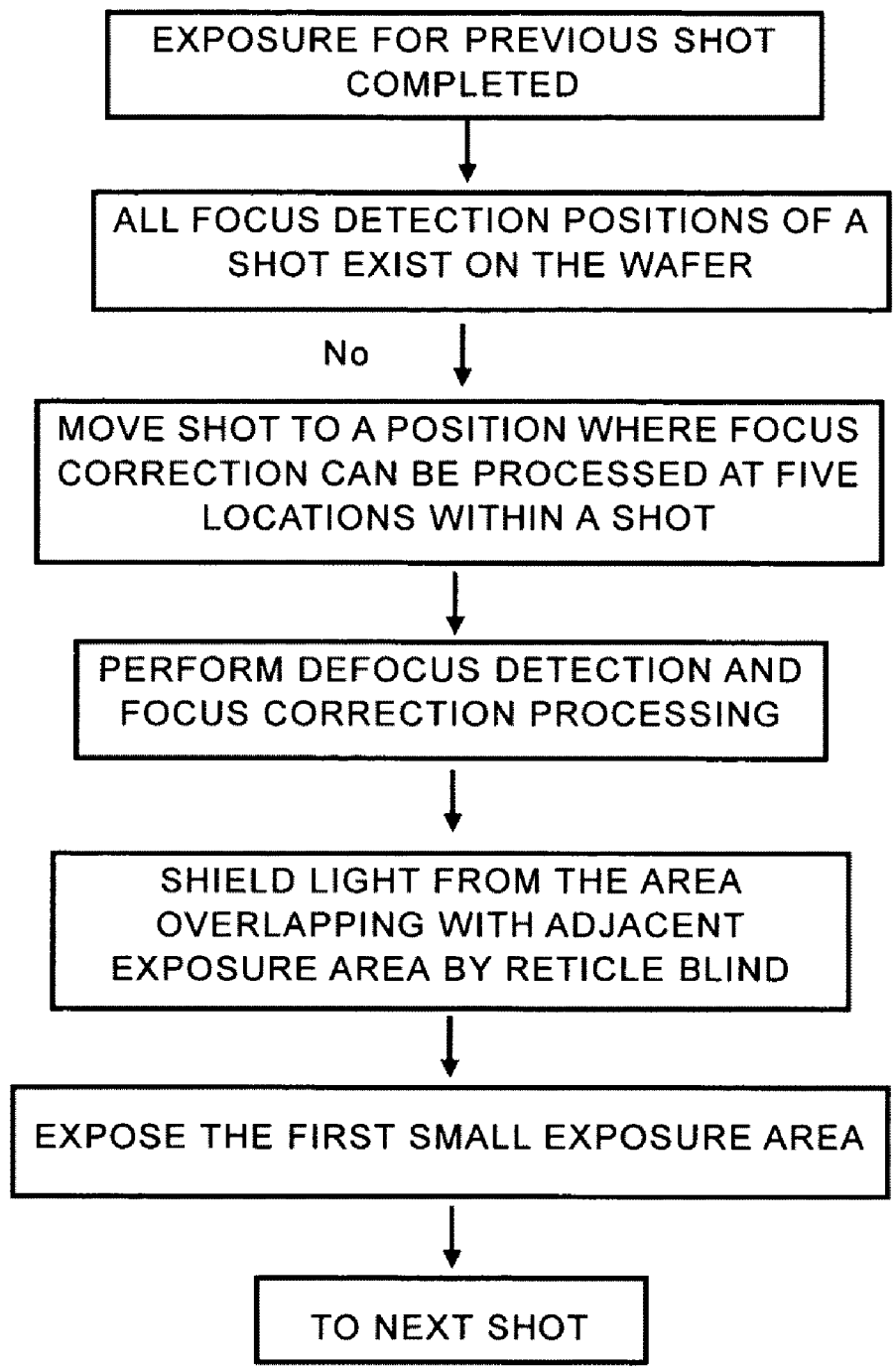
FIG. 3 is a flowchart illustrating an exposure method according to a first embodiment of the present invention.

FIG. 3 is a flowchart for explaining an exposure method related to the shot A in FIG. 2.

First, upon completion to expose a previous shot, a relative position of the subsequent shot A with respect to the wafer is confirmed, and it is confirmed whether five focus detection positions are on the wafer, or not. In this example, this may be considered as confirmation of whether the entire shot A is on the wafer, or not. When the five focus detection positions exist on the wafer, correction may be executed on the basis of defocus information obtained from the five positions to perform exposure. When a part of shot misses the wafer, the shot is moved to the shot C in FIG. 2 which is at a position where focus correction processing is enabled at five positions within the shot. Then, focus correction processing (autofocus, autoleveling) is performed at the five positions within the shot. Then, an area overlapped with the adjacent exposure area is shielded from light by the reticle blind. Then, only the first small exposure area g is exposed through an opening area surrounded by the reticle blind. In this case, such a layout that the number of semiconductor devices (semiconductor chips) formed in the first small exposure area g becomes largest is desirable.

Through the above operation, exposure at the position of the shot A is completed, and the same processing is repeated in the subsequent shot.

Figure 4:
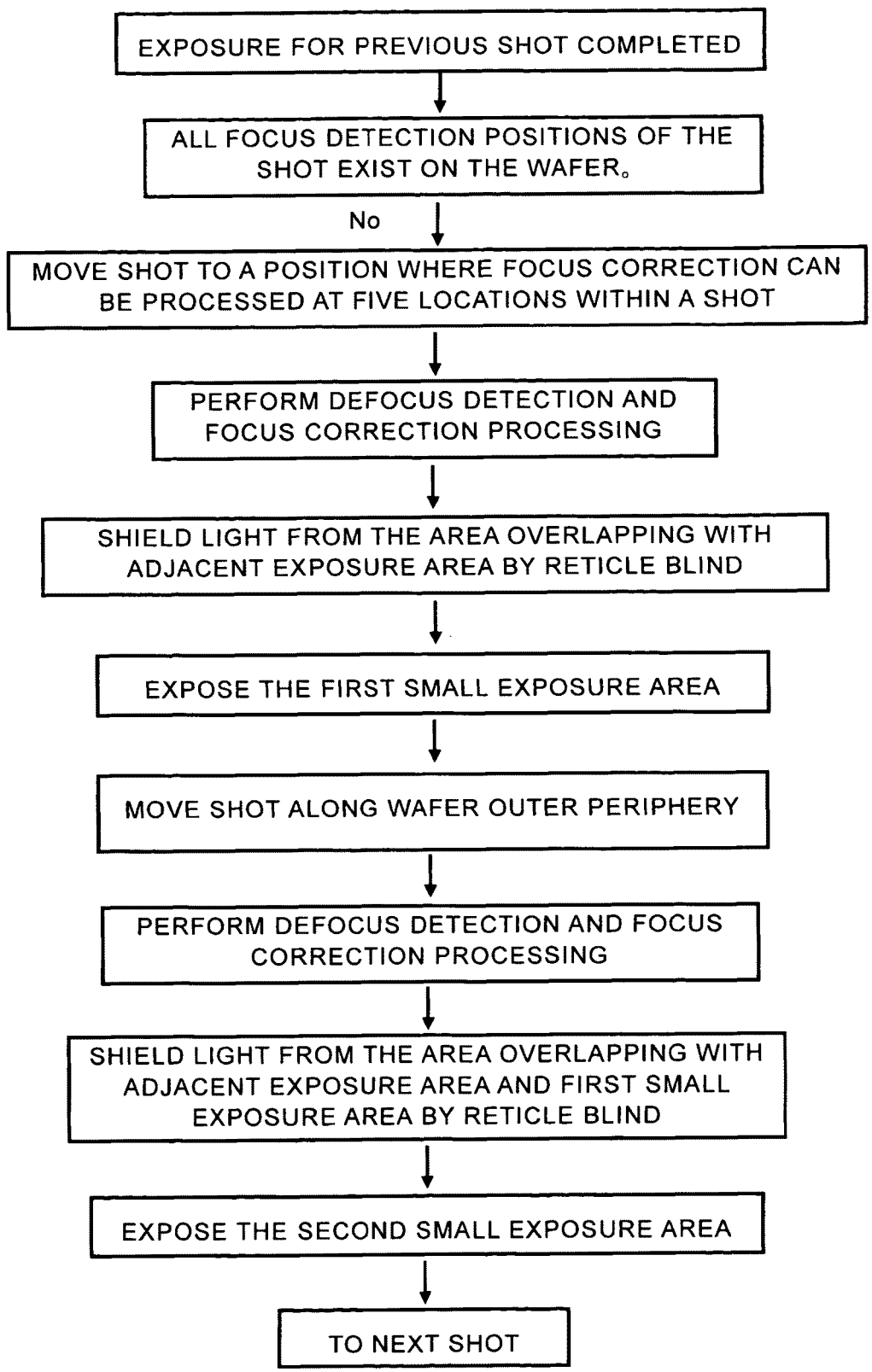
FIG. 4 is a flowchart illustrating an exposure method according to a second embodiment of the present invention.

FIG. 4 is a flowchart for explaining an exposure method related to the shot B in FIG. 2.

First, upon completion to expose a previous shot, a relative position of the subsequent shot B with respect to the wafer is confirmed, and it is confirmed whether five focus detection positions are on the wafer, or not. In this example, this may be considered as confirmation of whether the entire shot B is on the wafer, or not. When the five focus detection positions exist on the wafer, correction may be executed on the basis of defocus information obtained from the five positions to perform exposure. When a part of shot misses the wafer, the shot is moved to the shot D in FIG. 2 which is at a position where focus correction is enabled at five positions within the shot. Focus correction processing (autofocus, autoleveling) is then performed at the five positions within the shot. Then, an area overlapped with the adjacent exposure area is shielded from light by the reticle blind. Then, only the first small exposure area h is exposed through an opening area surrounded by the reticle blind.

Second, the shot D is moved to the position of the shot E in FIG. 2 so that one focus detection position is inscribed in the wafer outer periphery or an end of the shot exists on the wafer. Then, defocus is detected at five positions within the shot, and focus correction processing (autofocus, autoleveling) is performed. Then, an area overlapped with the adjacent exposure area and the first small exposure area h are shielded from light by the reticle blind. Then, only the second small exposure area i is exposed through an opening area surrounded by the reticle blind. In this case, such a layout that the number of semiconductor devices (semiconductor chips) formed in the first small exposure area h and the second small exposure area i becomes largest is desirable.

Through the above method, exposure at the position of the shot B is completed, and the same processing is repeated in the subsequent shot.

As has been described above, with application of the manufacturing method according to the present invention, the best focus position may be detected on the entire wafer surface with high precision, and a desired pattern may be appropriately exposed and transferred. Also, a larger number of semiconductor chips may be formed on the wafer.

The present invention is not limited to the exposure device of the step and repeat system, but may be completely similarly applied to exposure devices of various systems including an exposure device (X-ray exposure device, and so on) of a step and scan system or a proximity system. Also, the exposure illumination light (energy beam) used in the exposure device is not limited to an ultraviolet ray, but may include an x-ray (including an EUV ray), and charge particle radiation such as an electron beam or an ion beam. Also, the present invention may be applied to an exposure device used in manufacturing a DNA chip, a mask, a reticle, or the like.

What is claimed is:

1. A manufacturing method for a semiconductor device including a divisional exposure of a wafer, the method comprising:
    determining whether or not all of focus detection positions for an area of a subsequent shot are on the wafer, after exposure of a previous shot has been completed;
    moving the subsequent shot to a position where focus correction can be processed for all of the focus detection positions within the subsequent shot when at least one focus detection position among all of the focus detection positions is not on the wafer;
    performing defocus detection and focus correction processing by the moved subsequent shot;
    shielding an area overlapped with an adjacent exposure area from light by a reticle blind; and
    exposing a first small exposure area through an opening area surrounded by the reticle blind.

2. A manufacturing method for a semiconductor device according to claim 1, wherein a number of semiconductor devices formed in the first small exposure area is maximized.

3. A manufacturing method for a semiconductor device according to claim 1, wherein the reticle blind comprises a liquid crystal shutter.

4. A manufacturing method for a semiconductor device, which divisionally exposes a wafer, comprising:
- determining whether or not all of focus detection positions within an area of a subsequent shot are on the wafer, after exposure of a previous shot has been completed;
- moving the subsequent shot to a first position where focus correction processing is enabled at all of the focus detection positions within the subsequent shot when at least one focus detection position among all of the focus detection positions is not on the wafer;
- performing defocus detection and focus correction processing by the subsequent shot moved to the first position;
- shielding an area overlapped with an adjacent exposure area from light by a reticle blind;
- exposing a first small exposure area through an opening area surrounded by the reticle blind;
- moving the subsequent shot at the first position to a second position so that the subsequent shot is inscribed in a wafer outer periphery;
- performing defocus detection and focus correction processing by the subsequent shot moved to the second position;
- shielding an area overlapped with the adjacent exposure area and the first small exposure area from light by the reticle blind; and
- exposing a second small exposure area through an opening area surrounded by the reticle blind that shields the area overlapped with the adjacent exposure area and the first small exposure area from light.

5. A manufacturing method for a semiconductor device according to claim 4, wherein a number of semiconductor devices formed in the first small exposure area and the second small exposure area is maximized.

6. A manufacturing method for a semiconductor device according to claim 4, wherein a number of semiconductor devices formed in the first small exposure area and the second small exposure area is maximized except for an invalid area at a wafer outer periphery.

7. A manufacturing method for a semiconductor device according to claim 6, wherein the invalid area at the wafer outer periphery is an area of 3 mm from an edge of the wafer outer periphery.

8. A manufacturing method for a semiconductor device according to claim 4, wherein the reticle blind comprises a liquid crystal shutter.

* * * * *